United States Patent
Iravani

(10) Patent No.: US 10,673,413 B2
(45) Date of Patent: Jun. 2, 2020

(54) PROGRAMMABLE TERMINATION RESISTOR FOR HDMI TRANSMITTER OUTPUT

(71) Applicant: PICO Semiconductor, Inc., Los Altos, CA (US)

(72) Inventor: Kamran Iravani, Los Altos, CA (US)

(73) Assignee: PICO Semiconductor, Inc., Los Altos, CA (US)

(*) Notice: Subject to any disclaimer, the term of this patent is extended or adjusted under 35 U.S.C. 154(b) by 0 days.

(21) Appl. No.: 16/545,529

(22) Filed: Aug. 20, 2019

(65) Prior Publication Data

US 2020/0067492 A1    Feb. 27, 2020

Related U.S. Application Data

(60) Provisional application No. 62/720,772, filed on Aug. 21, 2018.

(51) Int. Cl.
| | | |
|---|---|---|
| *H03K 19/01* | (2006.01) | |
| *H03K 19/00* | (2006.01) | |
| *H03H 11/28* | (2006.01) | |
| *H03K 19/003* | (2006.01) | |
| *H03K 19/0175* | (2006.01) | |
| *H03K 19/018* | (2006.01) | |
| *H03K 19/0185* | (2006.01) | |

(52) U.S. Cl.
CPC ....... *H03H 11/28* (2013.01); *H03K 19/00315* (2013.01); *H03K 19/00369* (2013.01); *H03K 19/01812* (2013.01); *H03K 19/017545* (2013.01); *H03K 19/018528* (2013.01); *H03K 19/018585* (2013.01)

(58) Field of Classification Search
CPC ............. H04L 25/0276; H04L 25/0278; H04L 25/0264; H04L 25/028; G09G 2370/12; H03F 2203/45418; H03F 2203/45424; H03K 17/687; H03K 19/00315; H03K 19/017545; H03K 19/018578; H03K 19/0008; H03D 7/1441
See application file for complete search history.

(56) References Cited

U.S. PATENT DOCUMENTS

| | | | | |
|---|---|---|---|---|
| 7,397,270 B1* | 7/2008 | Luo | ................ | H03K 19/00369 326/115 |
| 7,564,270 B1* | 7/2009 | Zhang | .............. | H03K 19/00315 326/115 |
| 7,915,913 B2* | 3/2011 | Nakata | ................ | H04L 25/0278 326/30 |
| 7,974,589 B2* | 7/2011 | Jeffries | ............... | H04L 25/0276 327/108 |

(Continued)

*Primary Examiner* — Vibol Tan

(57) ABSTRACT

A supply-less transmitter output termination resistor with high accuracy is presented. This termination resistor can be used for applications with high supply voltage and low voltage devices. The termination resistor is programmable and includes many parallel branches. Each branch can be turned off or on with a switch. The biasing for the switch is in such a way that it keeps the resistance of the switch constant independent of the supply voltage or the output common mode voltage. This will increase the accuracy of the termination resistor. Besides HDMI this technique can be used for many other applications.

20 Claims, 2 Drawing Sheets

(56) References Cited

U.S. PATENT DOCUMENTS

| | | | |
|---|---|---|---|
| 8,169,266 B2* | 5/2012 | Rostami | H03D 7/1441 |
| | | | 327/359 |
| 8,416,005 B2* | 4/2013 | Luo | H03K 19/018528 |
| | | | 327/108 |
| 8,457,242 B2* | 6/2013 | Kim | H04L 25/028 |
| | | | 375/148 |
| 8,497,713 B2* | 7/2013 | den Besten | H04L 25/0272 |
| | | | 326/82 |
| 8,624,625 B2* | 1/2014 | Shin | H03K 19/017545 |
| | | | 326/30 |
| 9,325,316 B1* | 4/2016 | Abou-El-Sonoun | |
| | | | H03K 19/018514 |
| 10,033,552 B2* | 7/2018 | Agrawal | H04L 5/20 |
| 10,446,195 B2* | 10/2019 | Pan | G11C 5/14 |
| 2019/0190648 A1* | 6/2019 | Reimer | H04B 10/616 |

* cited by examiner

PROGRAMMABLE TERMINATION RESISTOR FOR HDMI TRANSMITTER OUTPUT

CROSS-REFERENCE TO RELATED APPLICATIONS

This application is a conversion of and claims priority to and the benefit of Provisional Patent Application No. 62/720,772, entitled "A PROGRAMMABLE TERMINATION RESISTOR FOR HDMI TRANSMITTER OUTPUT," having a filing Date of Aug. 21, 2018, which is herein incorporated by reference in its entirety.

TECHNICAL FIELD

The present invention relates to the field of CMOS technology transmitter design. More particularly, the present invention relates to a programmable termination resistor for transmitter outputs.

BACKGROUND ART

Transmitters are well known and widely used in the electronics industry. Within the communication field, Transmitters are used in a variety of applications. Such applications include, for example, wireline communications such as PCI express, SATA and HDMI, and optical communications such as SONET and GPON. Transmitters are typically designed to perform within a given set of boundary conditions and to perform according to a specified standard. Typical conditions include, for example, performance over operating temperature ranges, sensitivity to supply noise, and the like. Typical performance standards include, for example, Output signal jitter generation, output signal rise and fall time, output impedance, and the like.

A conventional HDMI transceiver is shown in FIG. 1. It consists of a transmitter 101 DC coupled to a receiver 102 through a transmission line 103. HDMI at low data rates does not require any termination at the transmitter side. However, at higher data rates the reflection degrades the performance, and the source termination 104 is needed.

FIG. 2 shows a typical piece of a conventional programmable resistor used in differential circuits including HDMI transmitter. It consists of 2 identical resistors 201 and 202 and a P transistor 203 as a switch. A programmable termination resistor consists of several of these pieces or branches in parallel. When the voltage of the gate of the P transistor in one branch is high the transistor is OFF, and it is like an open circuit, and consequently it does not have any impact on the total resistance. However, if the voltage of the gate is low, the transistor is ON, and the resistance of the branch will be equal to 2R+rds where rds is the Drain-Source resistance of the transistor. In this scheme the bulk connection of the transistor is normally connected to the supply voltage (VDD) or the common mode voltage of the output as shown in FIG. 3. Resistors 204 and 205 are large so they do not load the output.

In an HDMI application the supply voltage of the termination resistors at the receiver is 3.3V+/−5%. However, at the transmitter side the supply voltage might be smaller, e.g. 2.5V or 1.8V. The traditional scheme can still work as long as the devices used in the transmitter can tolerate 3.3V. However, if the devices cannot tolerate 3.3V, a special technique must be used to make sure the devices are not under stress. For example if P transistor 203 is a 1.8V device, the gate of the transistor cannot be connected to ground because the Gate-source or gate-drain voltage of a 1.8V device cannot be more than 1.8V+(~20%) in order to meet the required lifetime.

To solve this problem a technique was introduced in US20110096848 A1. FIG. 4 shows this technique in a simplified form. In this scheme the P transistor turns on or off through switch 403. The key point here is when the switch is on the low voltage at the gate of transistor 203 is not zero and it is around Vbias. Vbias is a constant voltage generated by a bandgap reference, or the like. Therefore, transistor 203 does not go under stress. Transistor 404 is used to protect the switch 403 from stress which is a conventional method. In this scheme Vref is a voltage proportional to common mode voltage of the output to make the range of the protection wider.

Although the above technique protects the devices from stress, it causes some inaccuracy in making calibrated termination resistor. The inaccuracy comes from the fact that since Vbias is fixed, any changes in the common mode voltage of the output due to change in the supply voltage or output current or the like, will cause changes in the Vgs and hence the rds of transistor 203. Since rds is not negligible and Vgs might change by several hundred mV, the inaccuracy might be several percentages.

SUMMARY OF THE INVENTION

Embodiments of the present invention provide termination resistors which do not have the inaccuracy problems of the prior art. The present invention provides a circuit capable of reliable operation while exhibiting very good accuracy for termination resistors.

In one embodiment, the present invention is implemented as a transmitter with reliable and accurate termination resistors. The termination resistor includes one or more parallel branches where each branch consists of 4 resistors and one transistor as a switch. It also includes a current source, a transistor and another switch. A feature of the invention is to provide the biasing voltage for the gate of transistor (e.g., transistor 203) in such a way that the rds of the transistor stays almost constant so the accuracy of the termination resistor stays high. The present invention provides an advantageous solution to the above requirements.

The foregoing is a summary and thus contains, by necessity, simplifications, generalizations and omissions of detail; consequently, those skilled in the art will appreciate that the summary is illustrative only and is not intended to be in any way limiting. Other aspects, inventive features, and advantages of the present invention, as defined solely by the claims, will become apparent in the non-limiting detailed description set forth below.

BRIEF DESCRIPTION OF THE DRAWINGS

The accompanying drawings, which are incorporated in and form a part of this specification, illustrate embodiments of the invention and, together with the description, serve to explain the principles of the invention.

DETAILED DESCRIPTION OF THE EMBODIMENTS

Reference will now be made in detail to the preferred embodiments of the present invention, examples of which are illustrated in the accompanying drawing. While the invention will be described in conjunction with the preferred embodiments, it will be understood that they are not intended to limit the invention to these embodiments. On the contrary, the invention is intended to cover alternatives, modifications and equivalents, which may be included within the spirit and scope of the invention as defined by the appended claims. Furthermore, in the following detailed description of embodiments of the present invention, numerous specific details are set forth in order to provide a thorough understanding of the present invention. However, it will be recognized by one of ordinary skill in the art that the present invention may be practiced without these specific details. In other instances, well-known methods, procedures, components, and circuits have not been described in detail as not to unnecessarily obscure aspects of the embodiments of the present invention.

The present invention provides a termination resistor circuit which solves problems of the prior art. The present invention provides a circuit capable of reliable operation while keeping the high accuracy. The circuit of the present invention produces a stable, output signal with a waveform free of defects and irregularities. The present invention and its benefits are described in greater detail below.

Figure 1:
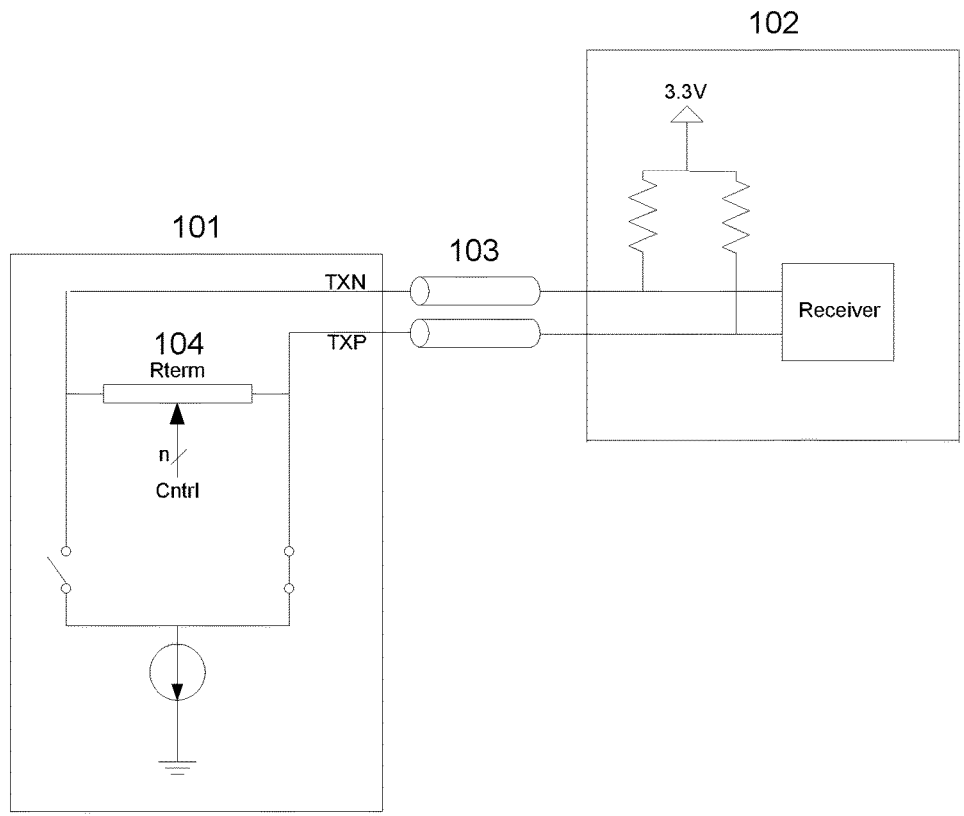
FIG. 1 shows a simplified schematic of a conventional transmitter output and receiver input for an HDMI transceiver in accordance with the prior art.
Figure 2:
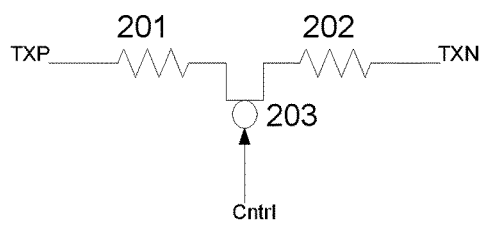
FIG. 2 shows a branch for a conventional termination resistor at transmitter output in accordance with the prior art.
Figure 3:
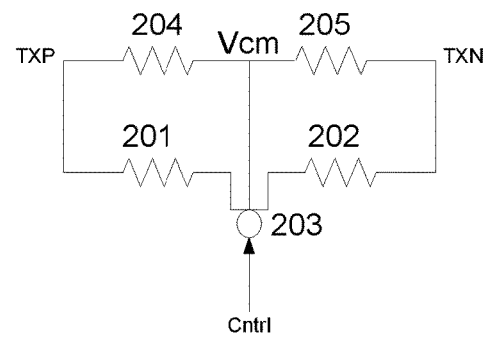
FIG. 3 shows a conventional way to provide voltage for the body of the P transistor in the branch in accordance with the prior art.
Figure 4:
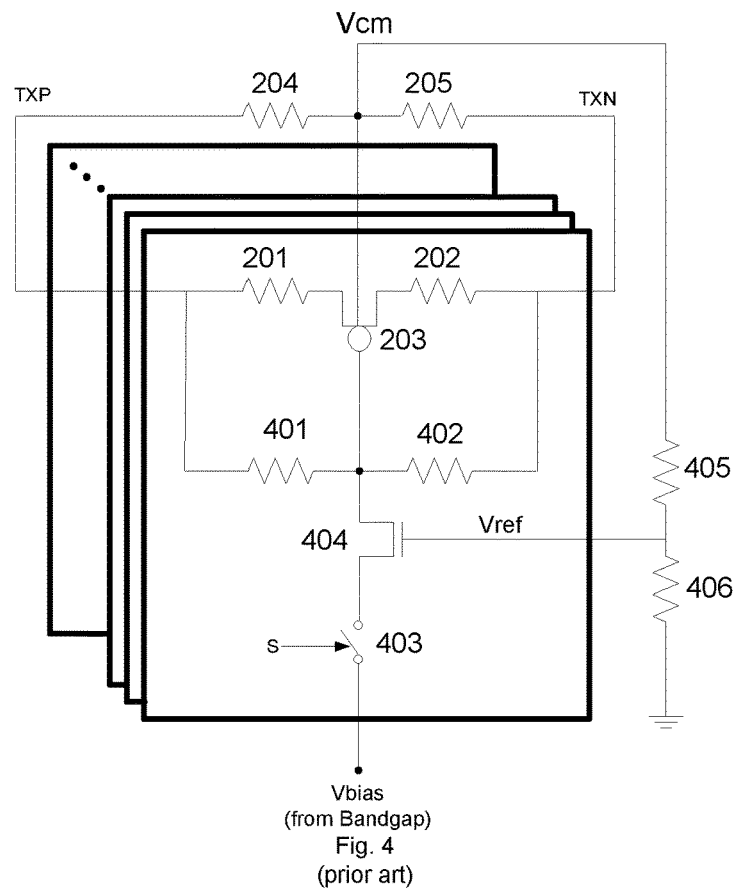
FIG. 4 shows the prior art technique to make the P switch in the branch stress free in accordance with the prior art.
Figure 5:
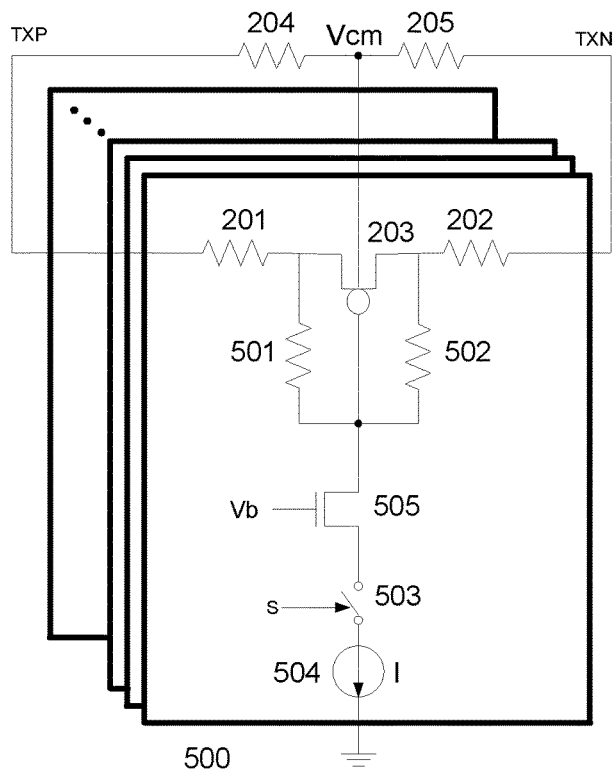
FIG. 5 shows the concept of the new invention to resolve the accuracy issue in accordance with the present invention.

FIG. 5 shows a simplified circuit diagram of the proposed termination resistor. Circuit 500 is comprised of termination resistors and the biasing circuit. Resistors 201 and 202 and transistor 203 as a switch form the main components of the branch. Resistors 501 and 502 along with switch 503 and current source 504 form the biasing circuits for switch 203. When the switch 503 is on, the average current flowing through each of 501 or 502 is half of the current of the current source 504. In other words I/2 goes through each of the resistors. The current flowing through 201 and 202 are usually high in comparison to 501 and 502.

In one embodiment, the resistors (501 and 502) are very large (e.g., 100K Ohm, etc.) and the currents flowing through them are so small that they are negligible compared to the current of the main branch going through 201 and 202. As an example if I is 6 uA and the resistors 501&502 are approximately 500K Ohm, there will be about 1.5V drop across the resistors. Therefore, switch 203 turns on because its gate voltage goes low. If the current of the current source 504, I, is proportional to Vbg/R where Vbg is a constant voltage generated by a bandgap circuit or the like, the voltage across resistors 501 & 502 will be constant no matter what the output common mode voltage Vcm is. Therefore, the rds of transistor 203 will not change if for any reason Vcm changes. This is a feature that differentiates the present invention from the prior art.

In one embodiment, transistor 505 protects switch 503 and the current source 504 from stress. The bias voltage of the gate of transistor 505, Vb, does not have to be a very accurate voltage. As long as Vb is within a range that the current of current source 504 is not impacted the circuit works fine. This is another advantage of this scheme based on current source which makes the design of the Vb generator straight forward.

It should be noted that, in one embodiment, the above described branches (e.g., parallel branches, etc.) can be identical or binary weighted or another number of ways suitable for the application. Each branch can be turned on or off by switch 503.

The foregoing descriptions of specific embodiments of the present invention have been presented for purposes of illustration and description. They are not intended to be exhaustive or to limit the invention to the precise forms disclosed, and obviously many modifications and variations are possible in light of the above teaching. The embodiments were chosen and described in order to best explain the principles of the invention and its practical application, to thereby enable others skilled in the art to best utilize the invention and various embodiments with various modifications as are suited to the particular use contemplated. It is intended that the scope of the invention be defined by the claims appended hereto and their equivalents.

What is claimed is:

1. A termination resistor circuit, comprising:
   a branch comprising a first branch resistor and a second branch resistor;
   a transistor is coupled between the first branch resistor and the second branch resistor;
   a biasing circuit is coupled to a first node between the transistor and the first branch resistor and is coupled to a second node between the transistor and the second branch resistor, the biasing circuit further comprises:
   a first load resistor coupled to the first node and a second load resistor coupled to the second node;
   a switch coupled to the first load resistor and second load resistor; and
   a current source coupled to the first load resistor and second load resistor via the switch, wherein when the switch is on, the average current flowing through each of first and second load resistors is half of the current of the current source to bias the transistor.

2. The termination resistor circuit of claim 1, further comprising:
   a protection transistor coupled between the first and second load resistors and the switch and current source to protect the switch and the current source from stress.

3. The termination resistor circuit of claim 1, wherein the first and second load resistors comprise main components of a branch.

4. The termination resistor circuit of claim 1, wherein when the switch is on, the average current flowing through each of the first and second load resistors is half of the current of the current source.

5. The termination resistor circuit of claim 1, wherein the first and second load resistors are very large in comparison to the first branch resistor and the second branch resistor, causing currents flowing through the first and second load resistors to be negligible compared to the current of the branch going through the first branch resistor and the second branch resistor.

6. The termination resistor circuit of claim 1, wherein one half of the current from the current source flows to the first and second nodes.

7. The termination resistor circuit of claim 1, wherein the current of the current source is proportional to Vbg/R where Vbg is a constant voltage generated by a bandgap circuit, causing the voltage across first and second load resistors to be constant regardless of what the output common mode voltage Vcm is, such that the rds of the transistor will not change when Vcm changes.

8. A termination resistor circuit, comprising:
- a branch comprising a first branch resistor and a second branch resistor;
- a transistor is coupled between the first branch resistor and the second branch resistor;
- a biasing circuit is coupled to a first node between the transistor and the first branch resistor and is coupled to a second node between the transistor and the second branch resistor, the biasing circuit further comprises:
- a first load resistor coupled to the first node and a second load resistor coupled to the second node;
- a switch coupled to the first load resistor and second load resistor; and
- a current source coupled to the first load resistor and second load resistor via the switch, wherein when the switch is on, the average current flowing through each of first and second load resistors is half of the current of the current source to bias the transistor; and
- a protection transistor coupled between the first and second load resistors and the switch and current source to protect the switch and the current source from stress.

9. The termination resistor circuit of claim 8, wherein the first branch resistor and the second branch resistor comprise main components of a branch.

10. The termination resistor circuit of claim 8, wherein when the switch is on, the average current flowing through each of the first and second load resistors is half of the current of the current source.

11. The termination resistor circuit of claim 8, wherein the first and second load resistors are very large in comparison to the first branch resistor and the second branch resistor, causing currents flowing through the first and second load resistors to be negligible compared to the current of the branch going through the first branch resistor and the second branch resistor.

12. The termination resistor circuit of claim 8, wherein one half of the current from the current source flows to the first and second nodes.

13. The termination resistor circuit of claim 8, wherein the current of the current source is proportional to Vbg/R where Vbg is a constant voltage generated by a bandgap circuit, causing the voltage across first and second load resistors to be constant regardless of what the output common mode voltage Vcm is, such that the rds of the transistor will not change when Vcm changes.

14. A termination resistor circuit, comprising:
- a branch comprising a first branch resistor and a second branch resistor;
- a transistor is coupled between the first branch resistor and the second branch resistor;
- a biasing circuit is coupled to a first node between the transistor and the first branch resistor and is coupled to a second node between the transistor and the second branch resistor, the biasing circuit further comprises:
- a first load resistor coupled to the first node and a second load resistor coupled to the second node;
- a switch coupled to the first load resistor and second load resistor; and
- a current source coupled to the first load resistor and second load resistor via the switch, wherein when the switch is on, the average current flowing through each of first and second load resistors is half of the current of the current source to bias the transistor, wherein the current of the current source is proportional to Vbg/R where Vbg is a constant voltage generated by a bandgap circuit, causing the voltage across first and second load resistors to be constant regardless of what the output common mode voltage Vcm is, such that the rds of the transistor will not change when Vcm changes.

15. The termination resistor circuit of claim 14, further comprising:
- a protection transistor coupled between the first and second load resistors and the switch and current source to protect the switch and the current source from stress.

16. The termination resistor circuit of claim 14, wherein first branch resistor and the second branch resistor comprise main components of a branch.

17. The termination resistor circuit of claim 14, wherein when the switch is on, the average current flowing through each of the first and second load resistors is half of the current of the current source.

18. The termination resistor circuit of claim 14, wherein the first and second load resistors are very large in comparison to the first branch resistor and the second branch resistor, causing currents flowing through the first and second load resistors to be negligible compared to the current of the branch going through the first branch resistor and the second branch resistor.

19. The termination resistor circuit of claim 14, wherein one half of the current from the current source flows to the first and second nodes.

20. The termination resistor circuit of claim 14, wherein the first and second load resistors are approximately 100K Ohm or greater.

* * * * *